(12) United States Patent
Hedler et al.

(10) Patent No.: US 7,960,843 B2
(45) Date of Patent: Jun. 14, 2011

(54) CHIP ARRANGEMENT AND METHOD OF MANUFACTURING A CHIP ARRANGEMENT

(75) Inventors: Harry Hedler, Germering (DE); Roland Irsigler, Munich (DE)

(73) Assignee: Qimonda AG, Munich (DE)

( * ) Notice: Subject to any disclaimer, the term of this patent is extended or adjusted under 35 U.S.C. 154(b) by 155 days.

(21) Appl. No.: 12/485,727

(22) Filed: Jun. 16, 2009

(65) Prior Publication Data

US 2009/0321959 A1     Dec. 31, 2009

(30) Foreign Application Priority Data

Jun. 27, 2008     (DE) .......................... 10 2008 030 559

(51) Int. Cl.
*H01L 23/52*     (2006.01)
*H01L 23/48*     (2006.01)
*H01L 29/40*     (2006.01)
*H01L 27/146*    (2006.01)
*H01L 27/148*    (2006.01)

(52) U.S. Cl. ................ 257/777; 257/774; 257/E27.137; 257/E27.144; 257/E27.161

(58) Field of Classification Search .................. 257/777, 257/774, E27.137, E27.144, E27.161
See application file for complete search history.

(56) References Cited

U.S. PATENT DOCUMENTS

| | | | | |
|---|---|---|---|---|
| 5,977,640 A * | 11/1999 | Bertin et al. | ................... | 257/777 |
| 6,084,308 A * | 7/2000 | Kelkar et al. | ................... | 257/777 |
| 6,150,724 A * | 11/2000 | Wenzel et al. | ................. | 257/777 |
| 6,659,512 B1 * | 12/2003 | Harper et al. | ................... | 257/777 |
| 6,825,567 B1 * | 11/2004 | Wang et al. | ................... | 257/777 |
| 6,921,968 B2 * | 7/2005 | Chung | .......................... | 257/686 |
| 7,002,250 B2 * | 2/2006 | Hozoji et al. | ................. | 257/730 |
| 7,217,994 B2 | 5/2007 | Zhu et al. | | |
| 2007/0096160 A1 | 5/2007 | Beroz et al. | | |
| 2007/0228110 A1 | 10/2007 | Eldridge et al. | | |
| 2008/0128882 A1 | 6/2008 | Baek et al. | | |

* cited by examiner

*Primary Examiner* — Luan C Thai
(74) *Attorney, Agent, or Firm* — John S. Economou

(57) ABSTRACT

A chip arrangement includes a logic chip with electric contacts arranged on one side, at least one memory chip arrangement with electrical contacts arranged on at least one side, and a substrate with electrical contacts on both sides of the substrate. The logic chip is attached to the substrate and is electrically conductively coupled to the substrate. The memory chip arrangement is arranged on the logic chip on the side facing the substrate and is electrically conductive coupled to the logic chip. The substrate includes a plurality of electrical connections between the contacts of the one and the other side.

13 Claims, 8 Drawing Sheets

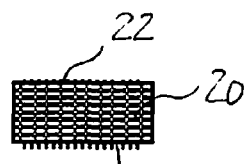
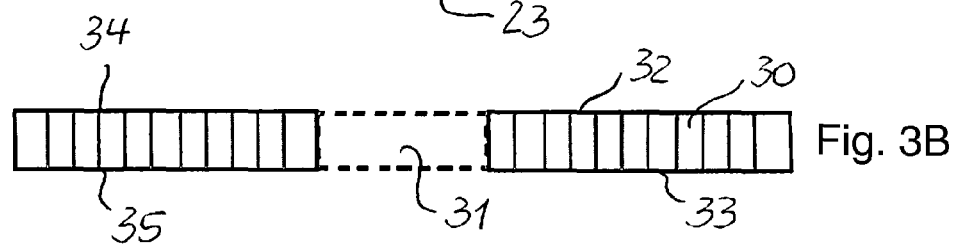
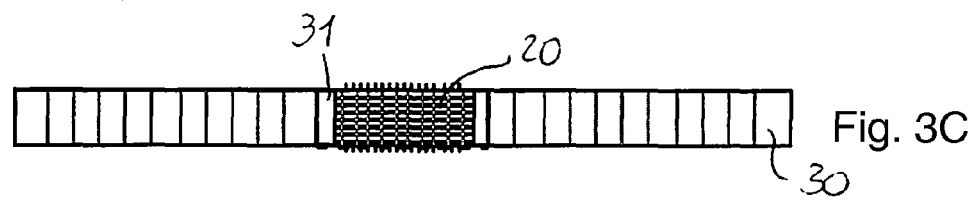
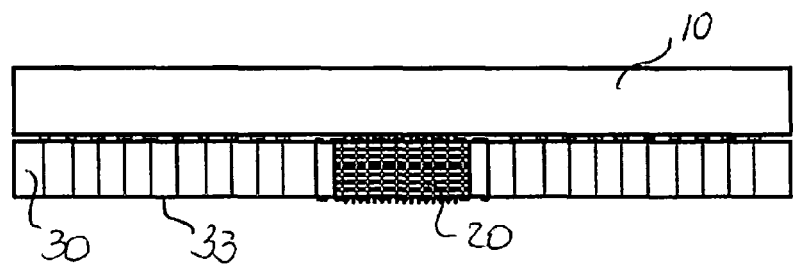
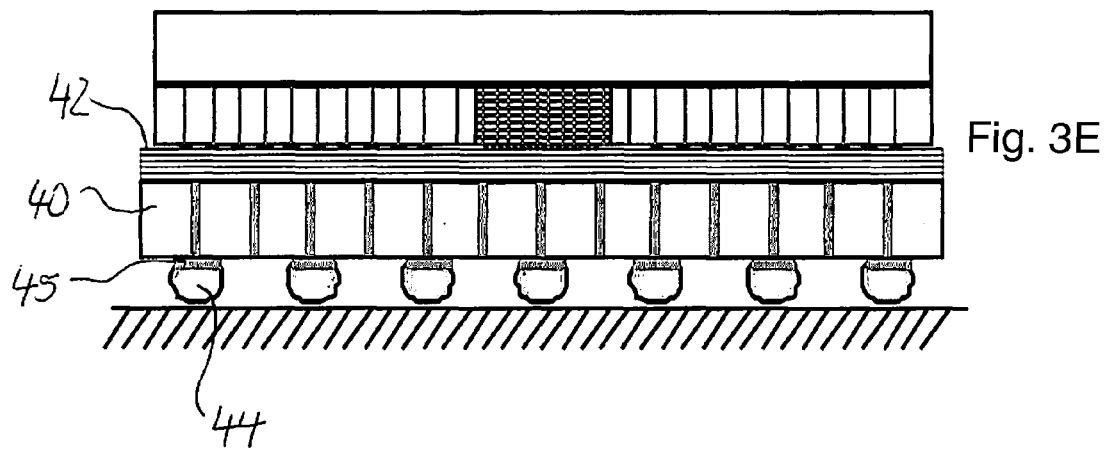

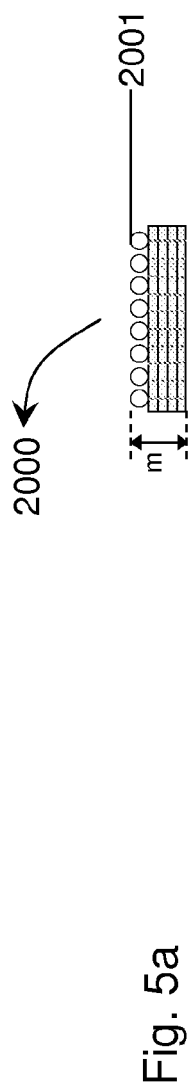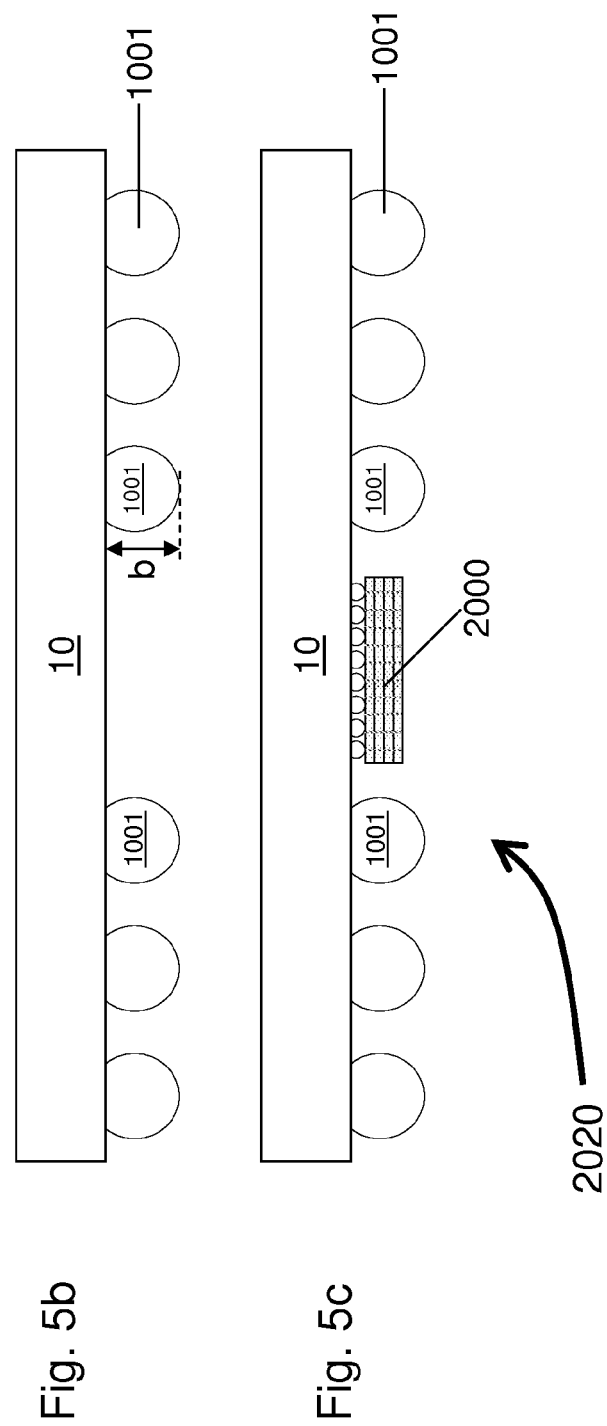

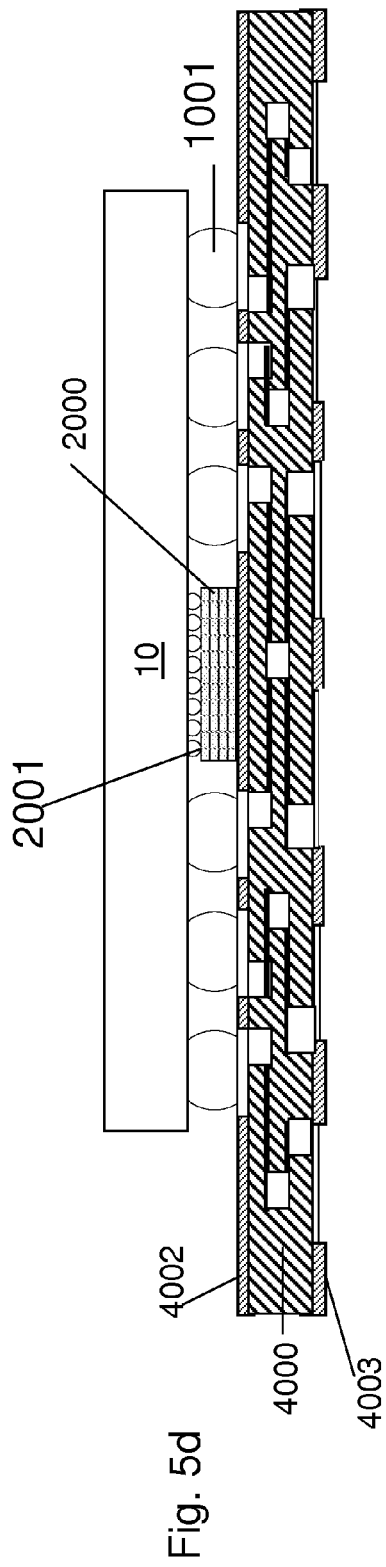
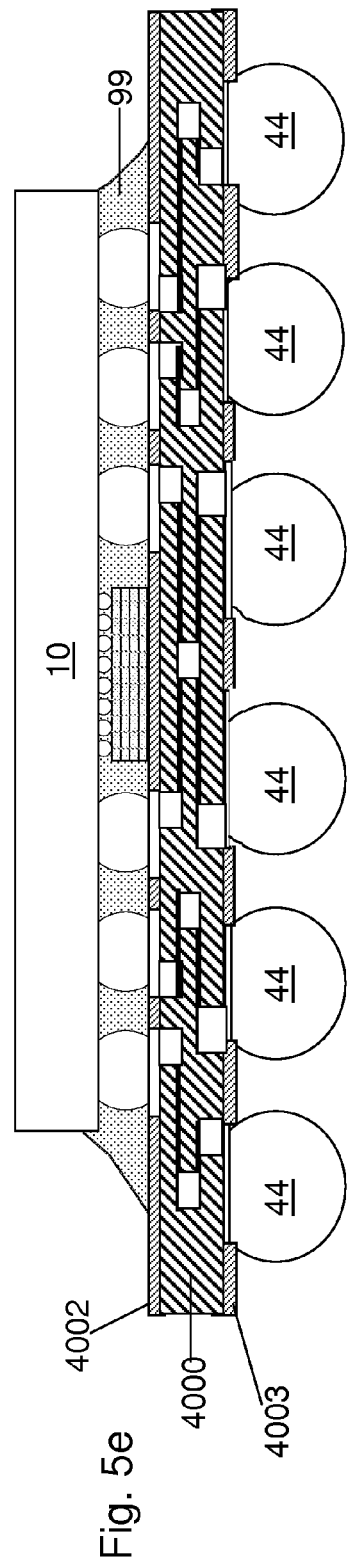
Fig. 5d
Fig. 5e

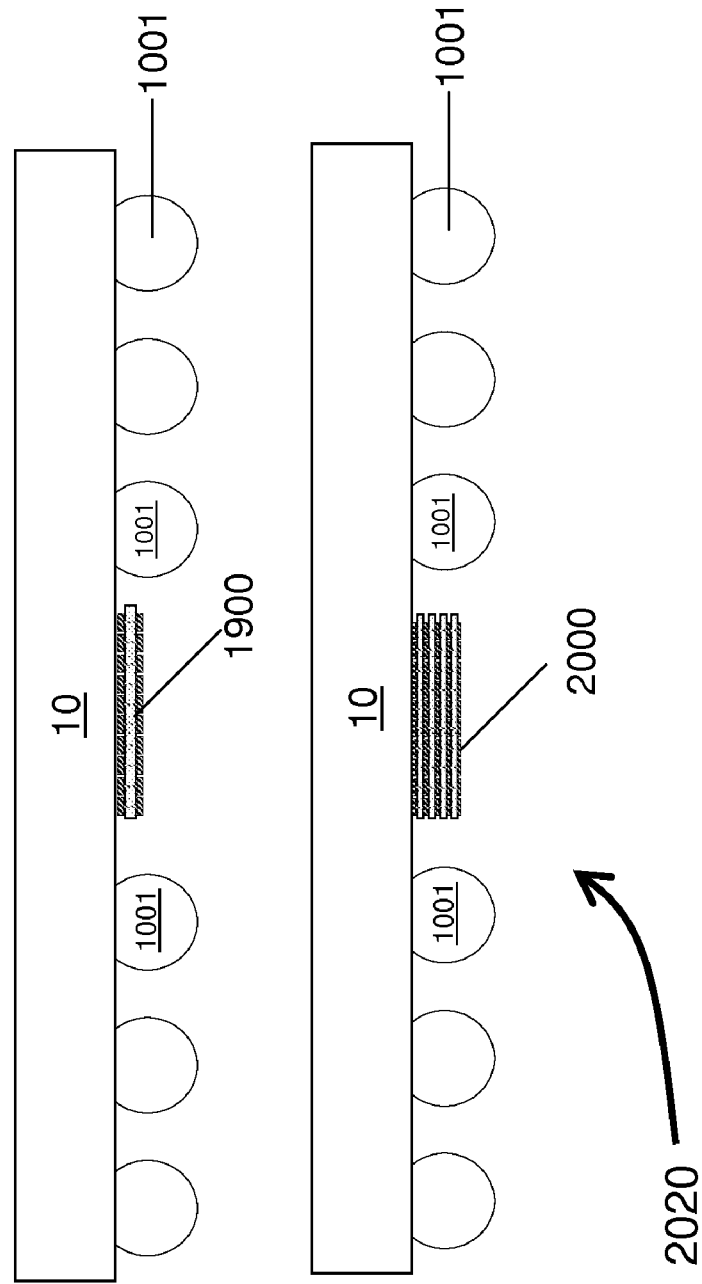

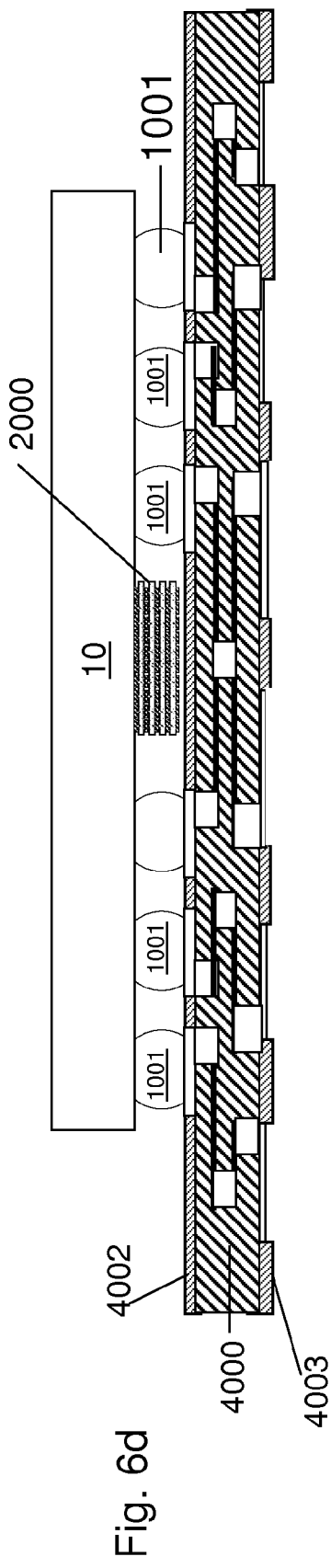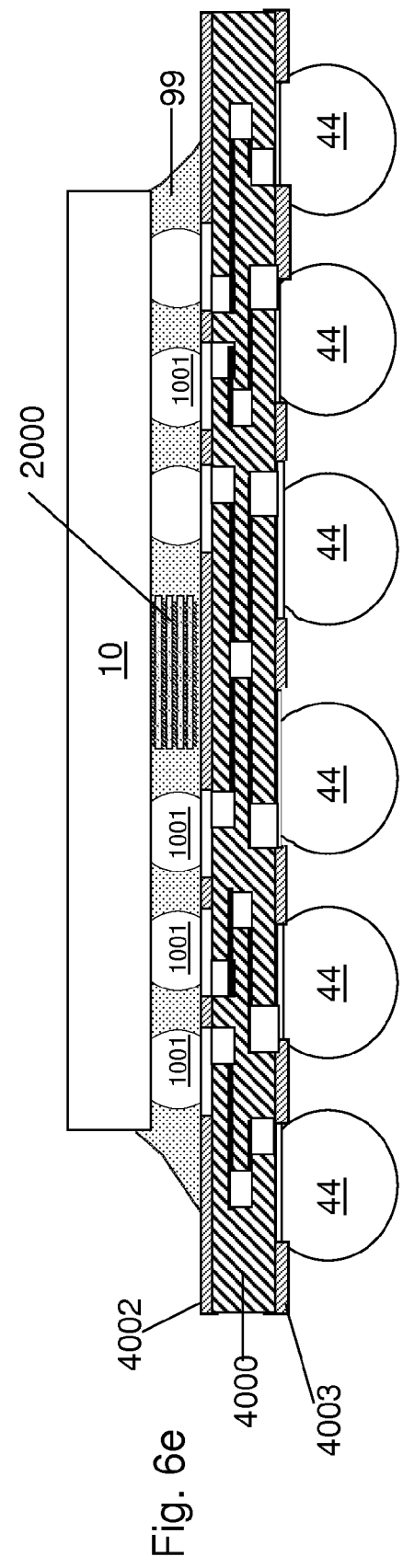

CHIP ARRANGEMENT AND METHOD OF MANUFACTURING A CHIP ARRANGEMENT

This application claims priority to German Patent Application 10 2008 030 559.6, which was filed Jun. 27, 2008 and is incorporated herein by reference.

TECHNICAL FIELD

The invention relates to a chip arrangement and a method of manufacturing a chip arrangement.

BACKGROUND

The development of electronic components in the form of a chip arrangement, for example, comprising a processor and a storage element, is affected by the requirements of a permanently growing, higher productivity of the electronic components with a demand for miniaturization and cost saving in their manufacturing.

SUMMARY

According to an embodiment, a chip arrangement and a method of manufacturing a chip arrangement will be provided, which cope with these requirements.

According to an embodiment of this invention, a chip arrangement will be created, providing a logic chip with contacts on one side, at least one memory chip arrangement with electronic contacts on at least one side and a substrate with electronic contacts on both sides of the substrate. The logic chip is arranged at the substrate and conductively coupled with the substrate. The memory chip arrangement is arranged on the logic chip facing the side of the substrate and is conductively coupled with the logic chip. The substrate also includes a plurality of electrical connections between the contacts of the one side and of the other side.

According to a further embodiment of the invention, a method for manufacturing a chip arrangement is provided. A logic chip, at least one memory chip arrangement and a substrate are provided. The substrate includes contacts for an electrically conductive connection on both sides and a recess of one side. The memory chip arrangement is arranged on the logic chip, forming a mechanical and electrically conductive connection between the memory chip arrangement and the logic chip. The logic chip is arranged on the substrate by placing the corresponding memory chip arrangement in the recess of the substrate forming a mechanical and electrically conductive connection between the logic chip and the substrate.

According to a further embodiment of the invention, a method will be created to manufacture a chip arrangement. A logic chip, at least one memory chip arrangement, and a substrate are provided. The substrate includes contacts for an electrically conductive connection and a thru hole. A further substrate includes contacts for an electrically conductive connection. The memory chip arrangement is arranged in the thru hole of the substrate. The logic chip is arranged on the substrate and a mechanical and electrically conductive connection is provided between the logic chip and the substrate and between the logic chip and the memory chip arrangement. The substrate is arranged on the further substrate and a mechanical and electrically conductive connection is provided between the substrate and the further substrate and between the memory chip arrangement and the further substrate.

BRIEF DESCRIPTION OF THE DRAWINGS

In the following, embodiments will be illustrated according to the invention with reference to the enclosed drawings. The drawings show:

FIG. 3, which includes FIGS. 3a-3e, provides a schematic view of the manufacturing steps of a chip arrangement according to an embodiment of the invention;

FIG. 5, which includes FIGS. 5a-5e, provides a schematic view of the manufacturing steps of a chip arrangement according to an embodiment of the invention; and FIG. 6, which includes FIGS. 6a-6e, provides a schematic view of the manufacturing steps of a chip arrangement according to an embodiment of the invention.

DETAILED DESCRIPTION OF ILLUSTRATIVE EMBODIMENTS

FIG. 1 shows a schematic view of a chip arrangement according to an embodiment of the invention.

Figure 1A:
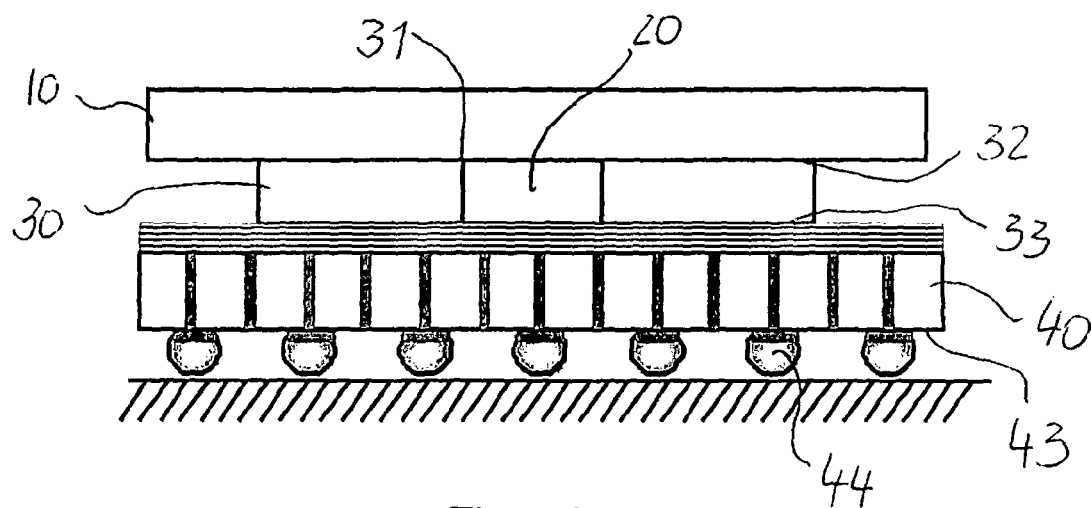
FIG. 1, which includes FIGS. 1a and 1b, provides a schematic view of a chip arrangement according to one embodiment of the invention.

As is shown in FIG. 1a, a simplified schematic chip arrangement comprises a logic chip 10, a memory chip arrangement 20, a substrate 30, and a further substrate 40 according to an embodiment.

The memory chip arrangement 20 is arranged on the logic chip 10 at the side facing the substrate 30 and is electrically conductively coupled to the logic chip 10. The logic chip 10 is arranged on the substrate 30 and electrically conductively coupled with it, wherein the substrate 30 comprises at least one recess 31, in which at least the memory chip arrangement 20 is arranged, so that the height of the memory chip arrangement 20 has no influence on the distance between the logic chip 10 and the substrate 30. The surfaces of the logic chip 10 and the substrate 30 facing each other each comprise a plurality of electrical contacts, with an electrically conductive connection formed between them, which may be signal lines or power lines. The contacts as well as the connections the connecting lines between them are arranged around the recess 31.

The memory chip arrangement 20 can be formed of two or more memory chips stacked on top of each other, so that the memory capacity of the memory chip arrangement 20 is accordingly adjustable while simultaneously diminishing the required contact area. Depending on the application of the chip arrangement and the required storage capacity, for example, 4, 8, 12, or 16 memory chips may be stacked on top of each other. A chip arrangement 20 having a reduced contact area, i.e., reduced area for providing contacts, with constant or increased storage capacity can be realized this way. The memory chips in the memory chip arrangement may be DRAM.

According to an embodiment the memory chip arrangement 20 may comprise at least one logic chip additionally to the memory chips.

The memory chip arrangement 20 comprises contacts for an electrically conductive connection of the memory chip arrangement 20 with the logic chip 10, thereby electrically conductively connecting the memory chip arrangement 20 and the logic chip 10. Depending on the embodiment the memory chip arrangement 20 may comprise additional contacts for the electrically conductive connection with the further substrate 40, so that the contacts are arranged at the free upper side of the uppermost memory chip of the memory chip arrangement 20 or alternatively at the free upper side of the uppermost memory chip and the free bottom side of the bottom memory chips of the memory chip arrangement 20.

The connections between the contacts of the memory chip arrangement 20 and the contacts of the specific memory chips or the memory chips and the at least one logic chip of the chip stack may be formed, for example, by thru vias (Thru-Silicon-Via) through the chips. By this connecting technique a comparatively small, compact and powerful memory chip may be provided.

As can be seen from the view of FIG. 1a, the further substrate 40 is arranged at the side 33 of the substrate 30 being opposite to the logic chip 10. The substrate 30 comprises at the side 33 facing towards the further substrate 40 a plurality of contacts, which comprise an electrically conductive connection with the contacts on the side 33 facing the logic chip as well as with the corresponding contacts of the further substrate 40. At the bottom side 43 of the further substrate 40, for example, contact elements 44 having the form of solder balls may be arranged.

Figure 1B:
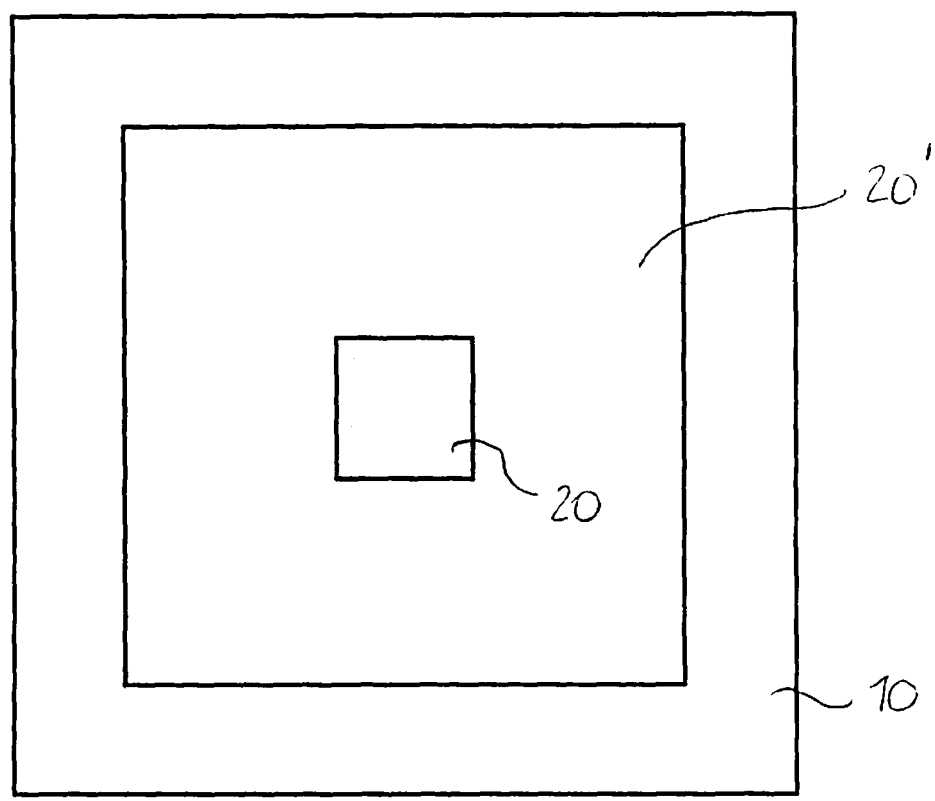

The view of FIG. 1b shows, according to an embodiment, exemplarily the size of logic chip 10 in comparison to a memory chip arrangement 20 of a chip arrangement attached to it.

The logic chip 10, which may be a central processing unit (CPU) may have a size of approximately 200 mm$^2$. The reference numeral 20' represents a typical planar DRAM with an area of approximately 100 mm$^2$ and the memory chip arrangement 20, which may be a DRAM with a stack of 8 stacked chips, is represented by an area of 12.5 mm$^2$.

As can be seen from this view, the corresponding chip arrangement provides a free area 20' around the memory chip arrangement 20 in which the most or all of the interconnects as power lines or signal lines between the logic chip 10 and the substrate arranged underneath it (not shown) may be arranged.

Since the substrate 30 comprises, according to an embodiment a recess 31 in which the memory chip arrangement 20 may be positioned, the interconnect lines between the logic chip 10 and the substrate may be kept at a short length, while the interconnect lines between the memory chip arrangement 20 and the logic chip 10 can as well be kept at a short length due to the arrangement.

Compared to a conventional arrangement, in which, for example, a logic chip and a memory chip arrangement 20, are both incorporated in separate housings and positioned beside each other on a substrate, the interconnect lines of the chip arrangement according to an embodiment of the invention can be drastically shortened, thereby improving the signal and current transfer rate and reducing the energy loss compared to a conventional arrangement.

While in view of FIG. 1b the memory chip arrangement 20 is positioned in the center relative to the logic chip 10, it is to be understood that the memory chip arrangement 20 can as well be positioned in various other arrangements relative to logic chip 10. The positioning of the memory chip arrangement 20 can be chosen according to the design of the logic chip 10 or can depend from the chip portion of the logic chip 10 comprising certain circuits. The recess in the substrate may be formed according to the position of the memory chip arrangement relative to the logic chip 10.

Figure 2:
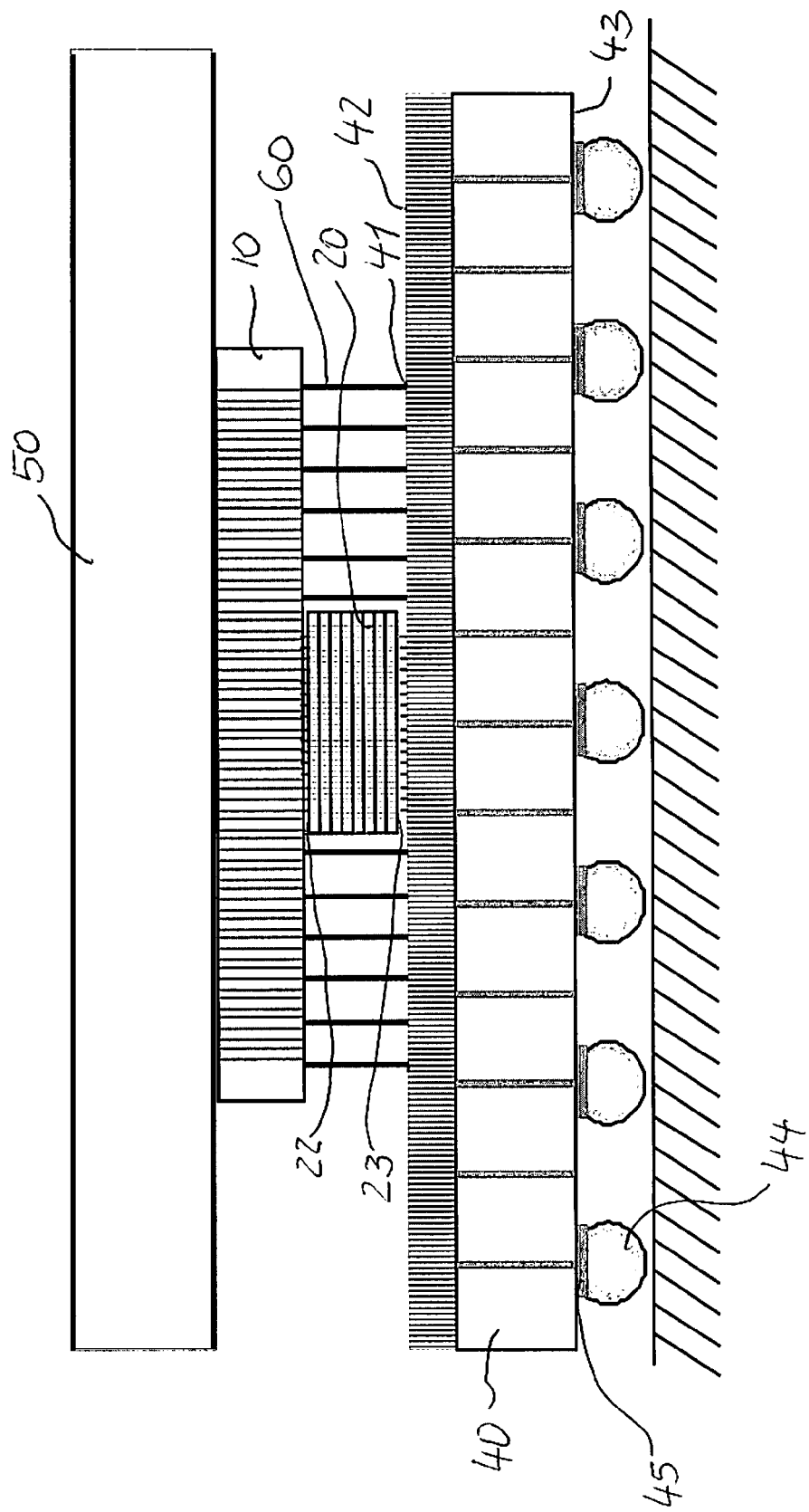
FIG. 2 provides a schematic view of a chip arrangement according to a further embodiment of the invention.

FIG. 2 shows a schematic view of a chip arrangement according to a further embodiment of the invention which is similar to the one shown in FIG. 1.

The chip arrangement in FIG. 2 comprises a logic chip 10, a memory chip arrangement 20, and a further substrate 40, wherein the substrate 40 may be a carrier, a circuit board or alike of a component module. The substrate 30 shown in FIG. 1 is not shown in FIG. 2 for the purpose of illustration of the embodiment.

As can be seen at least schematically from FIG. 2, the memory chip arrangement 20 comprises a chip stack of memory chips and, for example, at least one logic chip with thru contacts through the chips. The memory chip arrangement 20 comprises contacts as well on the side 22 facing the logic chip as also at the side 23 facing the further substrate 40. The contacts are coupled to corresponding contacts of the logic chip 10 and the further substrate 40 by an electrically conductive connection. The electrically conductive connections between the memory chip arrangement 20 and the logic chip 10 on the one side as well as between the memory chip arrangement 20 and the further substrate 40 on the other side may be provided by a soldering process of solder contact elements arranged at the contacts. It may as well be possible to provide the connection between the contacts of the memory chip arrangement 20 and the corresponding contacts of the logic chip 10 instead of or in addition to the soldering process by thermo compression bonding.

A further way to provide the electrically conductive connections between the contacts of the memory chip arrangement 20 and the contacts of the logic chip 10 may comprise providing an electrically conductive adhesive between the memory chip arrangement 20 and the logic chip 10.

In the embodiment shown in FIG. 2 the memory chip arrangement 20 comprises contacts on the side 22 facing the logic chip 10 as well as on the side 23 facing the further substrate 40.

As can be further seen in FIG. 2, the logic chip 10 comprises contacts at the side facing the memory chip arrangement 20 and wrapping around the memory chip arrangement 20, the contacts being connected, for example, to power line 60 extending towards contacts 41 arranged on the upper side of the further substrate 40. This way short interconnection lines can be realized between the individual elements of the chip arrangement.

As has been already explained with regard to FIG. 1, the power lines 60 as well as signal lines may be routed through an intermediate substrate (not shown, see element 30 of FIG. 1), wherein the substrate can be formed from one or more silicon layers, one or more layers of resin or alike. The resin layers may, for example, comprise glass fibers for reinforcement. It is to be understood that the substrate comprises a recess in form of a thru hole within this embodiment, with a memory chip arrangement 20 inserted into this hole.

The contacts 41 arranged on the further substrate 40 at the side 42 facing the logic chip 10 are connected to contacts 45 of the further substrate 40 at the bottom side 42, wherein the contacts 44 may be connected with contacts 44 having, for example, the form of solder elements in order to connect to a further mounting layer. The further substrate 40 may, for example, be formed from one or more silicon layers, one or more resin layers or alike, wherein the routing of the interconnection lines between the contacts 41 and the contacts 45 may be realized in various ways on or within the further substrate 40, for example, by a redistribution layer arranged on the upper side 42 of the further substrate 40.

Within the embodiment shown in FIG. 2 a suitable heat spreader element 50 is arranged on the logic chip 10 at the side opposite to the side of the memory chip arrangement 20, which, for example, may be attached to the logic chip 10 by a suitable adhesive and which is capable to transfer the heat generated within the logic chip towards the outer environment.

FIGS. 3a-3e, collectively FIG. 3, illustrate the structure of a chip arrangement according to an embodiment and the steps to manufacture it.

As shown in view FIG. 3a, a memory chip arrangement 20 is provided. The memory chip arrangement 20 may comprise a stack of memory chips and at least one logic chip and may be a so called DRAM. The memory chip arrangement 20 according to the exemplary embodiment comprises contacts at the top side 22 and the bottom side 23, wherein the interconnection between the contacts and the memory cells or circuitry of the memory chips and the at least one logic chip may, for example, be formed by thru vias through the chip (TSV-Thru-Silicon-Via-Technology). The contacts of the memory chip arrangement 20 may comprise contact elements like, for example, pins, solder contact elements or alike, if this is intended to provide an electrically conductive connection between the contacts of the logic chip 10 and/or the further substrate 40.

As can be seen in view FIG. 3b a substrate 30 is provided which can be composed as shown in the embodiment of FIG. 2. The substrate 30 comprises, at a predetermined position, the recess 31 which is realized as a thru hole.

The substrate 30 comprises a plurality of electrically conductive connections between the contact 34 on the one side 32 and contacts 35 on the opposite side 33. The interconnects between the contacts 34 and the contacts 35 may, for example, be realized by thru vias through the substrate 30. A different required positioning of the contacts 34 and/or the contacts 35 on the corresponding sides of the substrate 30, for example, by adapting to the arrangement of contacts of the logic chip 10 to be mounted or by adapting by the arrangement of contacts of the further substrate 40 to be mounted may, for example, be realized by a redistribution layer on the corresponding side. Although in the described embodiments the substrate 30 with the recess 31 is realized as one piece, it is to be understood that the substrate 30 may as well be composed of two or more assembled portions of a substrate.

As shown in view FIG. 3c, the memory chip arrangement 20 is placed into the recess 31 of the substrate 30 as the next step. An adhesive may be used for attaching the memory chip arrangement 20 into the recess 31 realized as a thru hole, for example, the adhesive can be arranged at least between a side wall of the recess 31 and the corresponding side wall of the memory chip arrangement 20.

After placing the memory chip arrangement 20 into the recess 31 of the substrate 30 the memory chip arrangement 20 can be functionally tested.

As shown in view FIG. 3d the logic chip 10 is subsequently mounted to the substrate 30 and the memory chip arrangement 20 positioned in the recess 31.

In order to realize an electrically conductive connection between the contacts 34 of the substrate 30 and the corresponding contacts of the logic chip 10, as well as between the contacts of the memory chip arrangement 20 and the corresponding contacts of the logic chip 10, the contacts of the logic chip 10 may be equipped, for example, with solder contact elements, such as solder balls before mounting it to the substrate 30. Even without referencing in the description of the embodiments in detail to it, it is to be understood that the contacts are formed according to the connection technique to be used. This means that the contacts of the logic chip 10, the contacts of the memory chip arrangement 20, and the contacts of the substrate 30 as well as the further substrate 40, if being used, may comprise a material, which is adapted to form a connection with a solder material in case that the connection of the corresponding contacts is intended to be realized by a solder process. In the case that the connection between corresponding contacts is to be made using a thermo compression bonding process, the contacts are formed accordingly. In case an electrically conductive interconnection between the contacts is to be realized using a conductive adhesive, the contacts are formed in a suitable manner.

In the case where the electrical interconnection between the logic chip 10 and the substrate 30 and the corresponding contacts of the memory chip arrangement 20 on the one side and the electrical connection between the substrate 30 and the memory chip arrangement 20 with the further substrate 40 on the other side is to be realized using a solder process, the logic chip 10 in the view of FIG. 3d may be intermediately fixed to the substrate and held in position using a adhesive. In the case that the solder material used for the logic chip 10 is sticky enough, the use of a further adhesive may be omitted.

As can seen in view of FIG. 3e, the substrate 30 being assembled to the logic chip 10 and the memory chip arrangement 20 is arranged onto the further substrate 40 with the side 33 being opposite to the logic chip 10. The contacts of the further substrate 40 on the side 42 be facing the substrate may in advance provided, for example, with solder contact elements.

After the chip arrangement according to this embodiment has been completed, a solder process may be performed in order to form a mechanically stable connection between the contacts and the solder contact elements and to realize the corresponding electrically conductive connections.

Subsequently the contacts 45 at the bottom side of the further substrate 40 of the chip arrangement may be provided with solder balls. The chip arrangement according to an embodiment may then be mounted into a housing, if desired.

With regard to FIGS. 4a-4e, collectively FIG. 4, the composition of a chip arrangement according to a further embodiment and the process steps to manufacture it are explained.

Figure 4A:
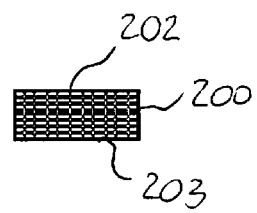
FIG. 4, which includes FIGS. 4a-4e, provides a schematic view of the manufacturing steps of a chip arrangement according to an embodiment of the invention.

As shown in view FIG. 4a, a memory chip arrangement 200 is provided. The memory chip arrangement 200 is formed from a stack of memory chips and at least one logic chip, and may be a so called DRAM. The memory chip arrangement 200 comprises, according to this embodiment, all contacts arranged on the top side 202, wherein the interconnections between the contacts and the memory cells or circuitry of the memory chips and the at least one logic chip may be formed, for example, by thru vias through the chips (TSV-Thru-Silicon-Via-Technology).

Figure 4B:
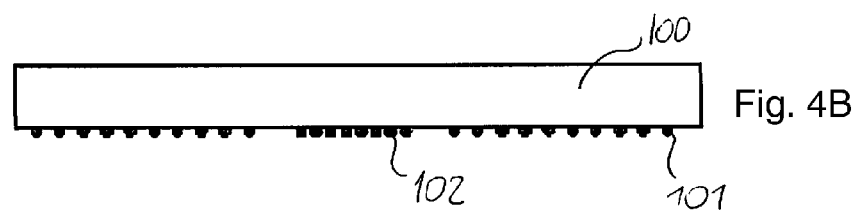

As shown in FIG. 4b, a logic chip 100 such as, for example, a central processing unit (CPU), an application specific integrated circuit (ASIC) among others, may further be provided.

The logic chip 100 comprises at one side, contacts that are, according to the embodiment shown, equipped with solder contacts elements 101, 102. The solder contacts elements 102 are arranged in an area, in which the memory chip arrangement 200 is to be positioned, and the solder contact elements 101 are distributed around the solder contact elements 102.

Figure 4C:
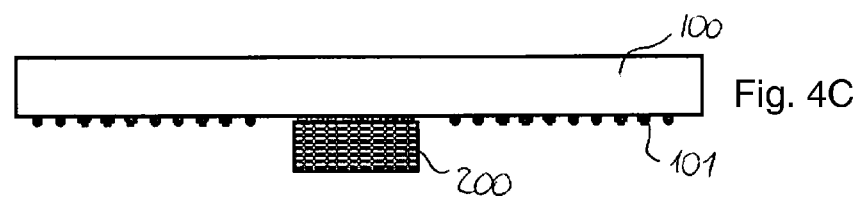

As illustrated in FIG. 4c the memory chip arrangement 200 is positioned relative to the logic chip 100 such that the contacts at the upper side 202 of the memory chip arrangement 200 are in contact with the corresponding solder contact elements 102 of the logic chip 100. A preliminary fixing of the memory chip arrangement 200 to the logic chip 100 may be realized, for example, by a suitable and non-conductive adhesive, if the adhesive force of the solder material of the solder contacts elements 102 is insufficient to fix the memory chip arrangement to the logic chip 100.

Figure 4D:
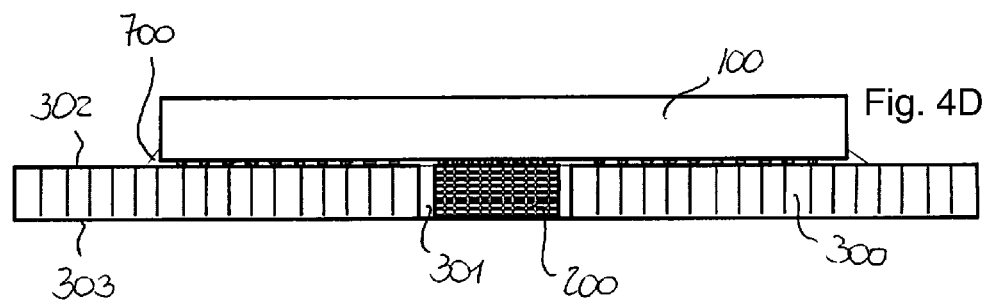

As shown in FIG. 4d, the logic chip 100 and the memory chip arrangement 200 fixed to it is positioned on a substrate 300 having a recess 301 with the shape of a thru hole. The positioning of the logic chip 100 onto the substrate 300 is done by inserting the memory chip arrangement 200 attached to the logic chip 100 into the recess 301 and positioning the solder contact elements 101 of the logic chip 100 onto the corresponding contacts at the upper side 302 of the substrate 300. The thickness of the substrate is selected such that the memory chip arrangement does not protrude beyond the bottom side 303 of the substrate 300. In other words, a substrate 300 may be used for the chip arrangement with a thickness selected according to the memory chip arrangement 200 used. Alternatively, as is to be understood from the aforementioned, standardized logic chip 100 and standardized substrate 300 may be used for various chip arrangements, if the thickness of the substrate 300 corresponds at least to the maximum stack height of the memory chip arrangement 200 to be selected or used. If the thickness, for example, of a standardized substrate 300 corresponds at least to the stack height of a memory chip arrangement 200 comprising, for example, 20 chips, the substrate 300 can be used for any memory chip arrangement 200 with 20 or less stacked chips. It is obvious that the area of the chips of the chip stack may not exceed a predetermined dimension, since otherwise the memory chip arrangement 200 would not fit into the recess 301.

After this step, the chip arrangement may undergo a solder process, in which stable, electrically conductive connections between the contacts comprising the solder contact elements 101 and the corresponding contacts on the upper side of the substrate as well as between the contacts comprising the solder contact elements 102 and the corresponding contacts on the upper side 202 of the memory chip arrangement 200 are formed. Subsequently, in order to stabilize the chip arrangement, a suitable backfill material 700 may be introduced into the spacing between the logic chip 100 thereby surrounding the connecting portions between them.

Figure 4E:
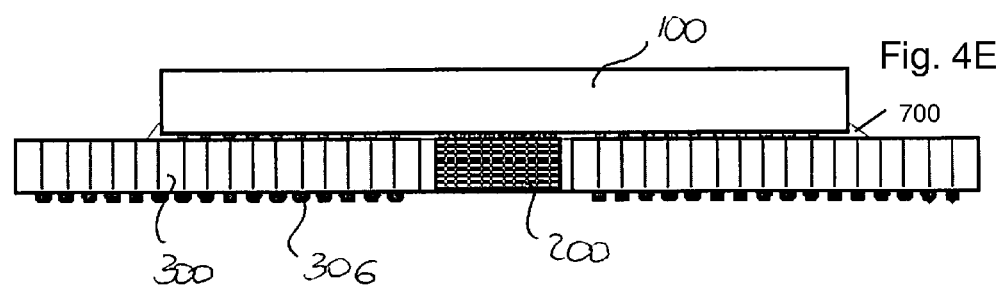

As shown in FIG. 4e, the contacts at the bottom side 303 of the substrate 300 may be equipped with solder contact elements 306, for example, having the shape of solder balls.

The interconnections or interconnection lines between the contacts at the upper side 202 of the memory chip arrangement 200 and the solder contact elements 306 at the bottom side 303 of the substrate 300 required to supply power to the memory chip arrangement 200 may, for example, be realized by a redistribution layer, which is formed on the side of the logic chip 100 facing the memory chip arrangement 200. In other words a voltage supplied to the solder contact elements 306 via an interconnection line extending from corresponding contacts may be transferred to predetermined contacts at the upper side 302 of the substrate 300 and further to predetermined contacts of the memory chip arrangement 200 via a redistribution layer formed along the logic chip 100. Optionally, the interconnection lines providing an electrically conductive connection between the corresponding contacts of the memory chip arrangement 200 and the corresponding circuitry of the logic chip 100 may be realized by a redistribution layer formed on the logic chip 100.

With reference to the chip arrangement according to FIG. 4, a redistribution layer may be formed, for example, at the upper side 302 of the substrate 300 by which the contacts at the upper side 302 of the substrate 300 connected to the solder contact elements 306 may be redistributed along the whole area of the substrate 300 in a predetermined grid. Interconnection lines may extend from the redistributed contacts (not shown) through the substrate 300 to the bottom side 303 of the substrate 300 and are available as contacts to be equipped with solder contact elements 306. This way the connection area of the substrate 300 to be coupled to the next mounting layer, e.g., a motherboard, may be increased.

As explained within the embodiment of FIG. 4, the memory chip arrangement is not directly coupled to the substrate 300. This means that the recess 301 in the substrate 300 does not necessarily need to be formed as a thru hole for a functional chip arrangement. Furthermore, the recess may be formed as a depression having a bottom surface with a depth sufficient to insert the memory chip arrangement 200. If the bottom side 303 of the substrate 300 forms a continuous surface, contacts can be provided in the area enclosing the recess of the substrate 300 wherein for this purpose a redistribution layer may be formed at the bottom side 303 of the substrate 300 at least in the aforementioned area, by which contacts at the bottom side 303 of the substrate 300 being connected to contacts at the upper side of the substrate 300 via interconnects extending through the substrate 300 may be redistributed within the area underneath the recess 301.

In case the substrate 300 acting as carrier for the logic chip 100 comprises silicon, the substrate as well as the logic chip 100 may be provided ready for contact on the wafer level, since the redistribution layers may be processed on the wafer level. The risk of damage due to different lateral expansion can be prevented, because in a chip arrangement according to an embodiment, the logic chip, the memory chip arrangement, the substrate and the optional further substrate comprise silicon and therefore have equivalent thermal expansion properties.

With the chip arrangement according to an embodiment of the invention an electronic component is provided comprising a logic chip, a memory chip arrangement as a chip stack and a substrate serving as a carrier wherein the logic chip 100 having a significantly larger area compared to the memory chip arrangement 200 is arranged on the memory chip arrangement 200, the chip arrangement being adapted to allow arrangement of at least the majority of the plurality of power and signal lines between the logic chip and the carrier, here the substrate 300, around the memory chip arrangement 200, such that the memory chip arrangement 200, here, for example, a DRAM, is not affected by the plurality of the power and signal lines. Since the substrate 300 may also be used as a carrier comprising contacts for conductive connection with the next mounting layer, and the plurality of power and signal lines between the logic chip 100 and the connections of the next mounting layer only leads through the substrate 300, the chip arrangement comprises significantly reduced connections paths, thereby strongly reducing voltage loss and strongly improving the performance of the chip arrangement. Since the memory chip arrangement 200 is coupled directly to the logic chip 100 the interconnection lines between the memory chip arrangement 200 and the logic chip 100 may be realized in the shortest possible way thereby improving the power and signal transfer rate between the memory chip arrangement 200 and the logic chip 100.

Since the logic chip 100 forms the uppermost element of the chip arrangement according to an embodiment of the invention, a heat spreader element may be arranged directly on top of it. As is to be understood, the chip arrangement according to an embodiment may be incorporated into a package, which may be manufactured by die casting wherein the bottom side 303 of the substrate 300 with the solder contact elements 306 at the connection side may be kept free of the housing material in order to allow coupling to a next mounting layer.

Accordingly, a housing or package including a CPU and a DRAM may be provided with a chip arrangement according to an embodiment of the invention, the housing or package comprising a reduced height, providing an improved energy efficiency due to significantly reduced paths between the CPU and the substrate serving as a carrier/circuit board as well as between the CPU and the DRAM, and comprising no reduction of the storage capacity of the DRAM due to the use of a DRAM as a chip stack as described before.

FIGS. 5 and 6 illustrate an alternate embodiment of the chip arrangement. Unlike the prior embodiments, the memory chip arrangement is not disposed within a recess in the substrate. Rather, the memory chip arrangement is disposed between the contacts of the logic chip.

FIG. 5, which includes FIGS. 5a-5e, illustrates an embodiment of the chip arrangement and a method of forming the chip arrangement during various steps of manufacturing, in accordance with an embodiment of the invention.

Referring to FIG. 5a, as described in prior embodiments, the memory chip arrangement 2000 comprises two or more memory chips stacked on top of each other. The interconnections between the memory chips in different levels of the stack are electrically coupled, for example, using through substrate vias. As illustrated in FIG. 5a, the memory chip arrangement comprises memory chip arrangement contacts 2001 disposed on one side of the memory chip arrangement 2000.

Similarly, a logic chip 10 as described in prior embodiments is provided. Logic chip contacts 1011 are formed on the logic chip 10 as shown in FIG. 5b. In various embodiments, the logic chip contacts 1011 comprise solder bumps, pillars such as solder pillar bumps, or preformed conductive balls, as examples.

The memory chip arrangement is attached to the logic chip 10 via the memory chip arrangement contacts 2001. In various embodiments, the height 'b' of the logic chip contacts 1011 (see FIG. 5b) is larger than 'm,' the height of the memory chip arrangement 2000 (FIG. 5a). Hence, the memory chip arrangement 2000 is completely disposed between the logic chip contacts 1011. The integrated chip 2020 comprising the memory chip arrangement 2000 and logic chip 10 are tested for functionality in one embodiment.

Referring to FIG. 5d, the integrated chip 2020 is coupled to an interposer substrate 4000. In various embodiments, the interposer substrate comprises laminate, ceramic, silicon substrate, a printed circuit board, or any other suitable substrate. The interposer substrate 4000 comprises a plurality of interconnects that electrically couple the top surface 4002 of the interposer substrate 4000 to an opposite back surface 4003 of the interposer substrate 4000. The plurality of interconnects comprise via, metal lines, wires, and/or through vias in various embodiments.

As illustrated in FIG. 5e, a mold compound 99 is applied onto the integrated chip 2020. The mold compound 99 protects and provides mechanical support to the logic chip contacts 1001 and the memory chip arrangement 2000. Solder balls are applied to the back surface 4003 of the interposer substrate 4000, forming contacts for the logic chip 10, and thus forming the chip arrangement.

FIG. 6 illustrates a method of fabricating the chip arrangement, in accordance with an embodiment of the invention.

Referring to FIG. 6a, a single memory chip 1900 comprising through interconnect elements such as through silicon vias is fabricated as described in prior embodiments. The single memory chip 1900 is mounted on to a logic chip 10 between the logic chip contacts 1001 (FIG. 6b). Further levels of memory chip are mounted onto the bottom surface of the single memory chip 1900 forming a memory chip arrangement 2000 (FIG. 6c). As in prior embodiments, this integrated chip 2020 may be functionally tested.

Referring to FIG. 6d, the integrated chip 2020 is coupled to an interposer substrate 4000. In various embodiments, the interposer substrate comprises laminate, ceramic, silicon substrate, or a printed circuit board. The interposer substrate 4000 comprises a plurality of interconnects that electrically couple the top surface 4002 of the interposer substrate 4000 to an opposite back surface 4003 of the interposer substrate 4000. The plurality of interconnects comprise via, metal lines, wires, and/or through vias in various embodiments. As illustrated in FIG. 6e, a mold compound 99 is applied onto the integrated chip 2020 that protects and provides mechanical support to the logic chip contacts 1001 and the memory chip arrangement 2001. Solder balls are applied to the back surface 4003 of the interposer substrate 4000, forming contacts for the logic chip 10, and thus forming the chip arrangement.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A chip arrangement comprising:
    a logic chip with electric contacts arranged on one side;
    a memory chip arrangement with electrical contacts arranged on at least one side; and
    a substrate with electrical contacts on opposite sides of the substrate, the substrate further including electrical connections between the electrical contacts on opposite sides,
    wherein the logic chip is attached to the substrate and electrically conductively coupled to the substrate, and
    wherein the memory chip arrangement is arranged on the logic chip on a side facing the substrate and is electrically conductively coupled to the logic chip, and
    wherein the memory chip arrangement includes memory chips and at least one logic chip and, wherein the electrical connections between the electrical contacts of the memory chip arrangement and contacts of the memory chips and/or contacts between the memory chips and the at least one logic chip are formed as thru vias through the memory chips.

2. The chip arrangement according to claim 1, wherein the memory chip arrangement is disposed above the substrate, wherein the logic chip is electrically conductively coupled to the substrate through solder contacts, and wherein the memory chip arrangement is disposed between the solder contacts.

3. The chip arrangement according to claim 1, wherein a contact portion of the logic chip is larger than a contact portion of the memory chip arrangement.

4. The chip arrangement according to claim 1, wherein the memory chip arrangement is located in a recess in the substrate.

5. The chip arrangement according to claim 4, wherein the electrical contacts are arranged on the substrate around the recess.

6. The chip arrangement according to claim 4, wherein the recess in the substrate comprises a bottom plane with contacts configured to electrically conductively connect to the electrical contacts of the memory chip arrangement facing the bottom plane.

7. The chip arrangement according to claim 4, wherein the recess in the substrate is a thru hole.

8. The chip arrangement according to claim 1, wherein the electrical connections of the substrate comprise thru vias through the substrate.

9. The chip arrangement according to claim 1, wherein connections between contacts arranged on one side of the substrate are formed by a redistribution layer.

10. The chip arrangement according to claim 1, wherein electrical contacts of the memory chip arrangement are connected to the electrical contacts of the substrate by a redistribution layer formed on the logic chip.

11. The chip arrangement according to claim 1, further comprising an additional mounting layer with contacts, wherein the contacts are connected to the substrate on a side opposite to the logic chip.

12. The chip arrangement according to claim 11, wherein the additional mounting layer is formed by a further substrate comprising at its bottom side and its upper side contacts for an electrically conductive connection.

13. The chip arrangement according to claim 12, wherein electrical contacts of the memory chip arrangement are connected to the electric contacts of the logic chip on a side facing the logic chip and the electrical contacts of the memory chip arrangement are connected to the further substrate on a side opposite to the logic chip.

* * * * *